US008669190B2

(12) United States Patent
Togo et al.

(10) Patent No.: US 8,669,190 B2
(45) Date of Patent: Mar. 11, 2014

(54) METHOD FOR MANUFACTURING SEMICONDUCTOR DEVICE AND SEMICONDUCTOR WAFER

(75) Inventors: Kenji Togo, Kawasaki (JP); Hiroaki Sano, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 13/366,720

(22) Filed: Feb. 6, 2012

(65) Prior Publication Data

US 2012/0199978 A1    Aug. 9, 2012

(30) Foreign Application Priority Data

Feb. 9, 2011  (JP) ................................ 2011-026349
Oct. 7, 2011  (JP) ................................ 2011-223295

(51) Int. Cl.
*H01L 21/461* (2006.01)

(52) U.S. Cl.
USPC ............ 438/754; 257/E21.218; 257/E21.219; 257/E21.222; 257/E21.238; 257/E21.245; 257/E21.25; 257/E21.483; 438/68; 438/597; 438/689; 438/706; 438/745

(58) Field of Classification Search
USPC ................... 257/E21.218, E21.219, E21.222, 257/E21.238, E21.245, E21.25, E21.483; 438/68, 597, 689, 706, 745, 754
See application file for complete search history.

(56) References Cited

U.S. PATENT DOCUMENTS 5,994,762 A * 11/1999 Suwanai et al. .............. 257/620

FOREIGN PATENT DOCUMENTS

JP     2006-093402 A    4/2006

* cited by examiner

*Primary Examiner* — Asok K Sarkar
(74) *Attorney, Agent, or Firm* — Canon USA, Inc. IP Division

(57) ABSTRACT

In a method for manufacturing a semiconductor device, a process of providing a semiconductor wafer having a wiring layer having conductive patterns and a plurality of insulation films containing a first insulation film surrounding side surfaces of the conductive patterns are provided. After the process of providing the semiconductor wafer, a process of removing some regions of the plurality of insulation films to form openings is provided. Herein, the first insulation film is disposed to a position closer to the circumference of the semiconductor wafer than a position closest to the outermost circumference of the wafer among the arrangement positions of the conductive patterns.

16 Claims, 15 Drawing Sheets

METHOD FOR MANUFACTURING SEMICONDUCTOR DEVICE AND SEMICONDUCTOR WAFER

BACKGROUND OF THE INVENTION

1. Field of the Invention

The present invention relates to a method for manufacturing a semiconductor device and a semiconductor wafer.

2. Description of the Related Art

In recent years, copper wiring has been utilized as a wiring material of a semiconductor device for achieving fine wiring. Japanese Patent Laid-Open No. 2006-093402 discloses a configuration of an end portion of a wafer forming a semiconductor device in a method for manufacturing a semiconductor device having copper wiring. Specifically, it is disclosed that a metal, copper herein, which is a conductor of wiring is formed on a circumference of a wafer rather than an insulation film on which wiring is formed, and a block layer is formed thereon. However, when etching the insulation film in a method for manufacturing wiring as in Japanese Patent Laid-Open No. 2006-093402, an insulator may be sometimes etched in a portion of an outer edge of a wafer where copper is formed. When the insulation film of the portion where copper is formed is removed, the copper may scatter to the wafer to cause metal contamination. Such metal contamination may occur in a semiconductor device having a wiring layer and undergoes a process of collectively removing a plurality of insulation films.

Accordingly, the present invention provides a method for manufacturing a semiconductor device capable of suppressing metal contamination. The present invention also provides a semiconductor wafer in which metal contamination is suppressed.

SUMMARY OF THE INVENTION

A method for manufacturing a semiconductor device of the invention includes, a process of preparing a semiconductor wafer having a wiring layer having conductive patterns and a plurality of insulation films containing a first insulation film surrounding side surfaces of the conductive patterns, and a process of removing some regions of the plurality of insulation films to form openings, in which the first insulation film is disposed to a position closer to a circumference of the semiconductor wafer than a position closest to the circumference of the wafer among the arrangement positions of the conductive patterns.

A semiconductor wafer of the present invention has a configuration such that, in a semiconductor wafer having a semiconductor device having an element, a wiring layer having conductive patterns, a plurality of insulation films containing a first insulation film surrounding the side surfaces of the conductive pattern, and an optical waveguide disposed on the plurality of insulation films, the first insulation film is disposed to the vicinity of a circumference of the semiconductor wafer relative to a position closest to the circumference of the semiconductor wafer among the arrangement positions of the conductive patterns.

A method for manufacturing a semiconductor device of the present invention includes a process of preparing a semiconductor wafer having a conductor portion and a plurality of insulation films and a process of removing some regions of the plurality of insulation films to form openings, in which the process of preparing the semiconductor wafer has a process of forming the first insulation film and a process of forming the conductor portion by forming a conductive film on the first insulation film, and, the first insulation film is formed so that an outer edge of the first insulation film is positioned at a first position and, the conductive film is formed so that an outer edge of the conductive film is positioned at a second position further from the circumference of the semiconductor wafer than the first position.

Further features of the present invention will become apparent from the following description of exemplary embodiments with reference to the attached drawings.

DESCRIPTION OF THE EMBODIMENTS

Figure 1A:
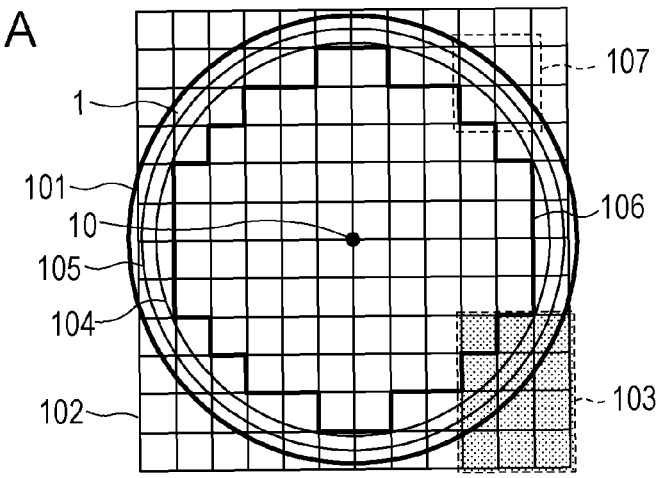
FIG. 1A is a plan schematic view of a wafer for describing Example 1.

The present invention has, in a method for manufacturing a semiconductor device having wiring layers having conductive patterns and a plurality of insulation films containing a first insulation film surrounding the side surfaces of the conductive pattern, a process of forming the plurality of insulation films on a semiconductor wafer and a process of forming the wiring layer. Moreover, the method includes a process of removing some regions of the plurality of insulation films to form openings after the process of forming the plurality of insulation films and the process of forming the wiring layers. Herein, the first insulation film is disposed to a position closer to the circumference of the semiconductor wafer than a position closest to the outermost circumference of the wafer among the arrangement positions of the conductive patterns.

Due to the configuration, exposure and scattering of metal materials constituting the wiring layer do not occur in the process of removing some regions of the plurality of insulation films. Therefore, a manufacturing method capable of suppressing the occurrence of metal contamination can be provided.

The present invention also relates to a wafer having a plurality of semiconductor devices having semiconductor substrates each having a plurality of elements, wiring layers having conductive patterns, a plurality of insulation films containing a first insulation film surrounding the side surfaces of the conductive patterns, and an optical waveguide disposed on the plurality of insulation films. Herein, the first insulation film is disposed to the vicinity of the circumference of the semiconductor wafer relative to a position closest to the circumference of the semiconductor wafer among the arrangement positions of the conductive patterns.

Due to the configuration, exposure and scattering of metal materials constituting the wiring layer do not occur in the process of removing some regions of the plurality of insulation films. Therefore, the occurrence of metal contamination can be suppressed.

Moreover, the present invention can also be applied to the case of comprising a silicide region, a light-shielding film, or the like in addition to the conductive pattern of the wiring layer. In addition to the conductive pattern of the wiring layer, the silicide region, the light-shielding film, or the like is used as a conductor portion and a metal film or the like for forming the conductor portion is used as a conductor film. In this case, the invention has a process of forming the outer edge of the first insulation film formed, before the formation of a conductive film for forming the conductor portion, to a position closer to the wafer circumference than the outer edge of the conductive film.

Hereinafter, the openings include both the case where the openings penetrate a plurality of interlayer insulation films and the case where the openings do not penetrate the films (concave portions), and the openings can be referred to as holes. As a configuration using the openings, a waveguide and a through hole via (through hole electrode) are mentioned as an example in Examples and the invention can also be applied to other configurations. The invention can be applied to general semiconductor devices and is particularly suitable for a solid-state image pick-up device in which a reduction in metal contamination has been expected.

Hereinafter, the invention is described in detail with reference to the drawings.

EXAMPLE 1

Example 1 is described with reference to FIG. 1A to FIG. 6C. First, the subject of the invention is described in more detail with reference to FIGS. 1A to 1C.

FIG. 1A is a plan schematic view of a semiconductor wafer 1 (hereinafter also referred to as a wafer) and an exposure region. FIG. 1A is a plan view as viewed from directly above a center 10 of the wafer 1 to the principal surface which is an element formation surface of the wafer. A circumference 101 of the wafer is the circumference of the wafer 1 and the outer edge of the principal surface of the wafer 1. FIG. 1A illustrates lattices for describing the exposure region. An exposure region 103 illustrates a range which is irradiated with exposure light in one exposure process. More specifically, a region corresponding to the 3×4 lattices is exposed in one exposure process. Although described in detail later, in this example, the exposure refers to exposure in a process of forming a mask pattern for etching (a certain layer).

Herein, generally, a plurality of semiconductor devices (semiconductor chips) are manufactured from one semiconductor wafer. In FIG. 1A, lattices 102 each corresponding to one semiconductor device are disposed on one wafer in the arrangement of 12×12.

Moreover, in order to increase the productivity, a plurality of semiconductor devices are exposed by one exposure. In this example, a region corresponding to 12 semiconductor devices is irradiated with light in the exposure region 103. Therefore, in this example, in order to expose the entire surface of the wafer 1 for forming one layer, 12 exposure processes are required. Herein, a region outside the circumference 101 of the wafer 1 is an invalid region in which a semiconductor device is not formed in practice. More specifically, when the region 102 is entirely present in the wafer, one semiconductor device is realized.

Figure 1B:
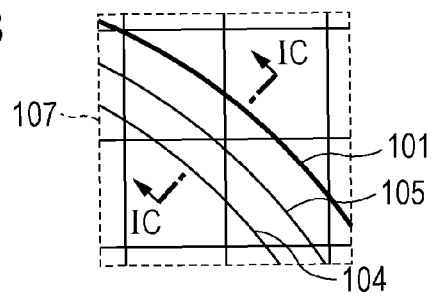
FIG. 1B is a plan schematic view of the wafer for describing Example 1.

In this example, an outer edge 105 of a region where a conductive pattern for forming a wiring layer is formed is disposed outside an outer edge 104 of a region where a first insulation film having the wiring layer is formed. FIG. 1B is a view in which a noticeable region 107 of FIG. 1A is enlarged. The outer edge 104 of a region where the first insulation film is formed and the outer edge 105 of a region where a conductor is formed are disposed in the stated order from the center 10 of the wafer to the circumference 101 of the wafer. Hereinafter, the direction from the center 10 of the wafer to the circumference 101 of the wafer is defined as a direction to the outside or the outside. The direction from the circumference 101 of the wafer to the center 10 of the wafer is defined as a direction to the inside or an inner side.

A region 106 where a semiconductor device can be formed is a region where one lattice is entirely disposed inside the circumference 101 of the wafer, the outer edge 105, and the outer edge 104. In the configuration of this example, the number of semiconductor devices to be completed is 72.

Figure 1C:
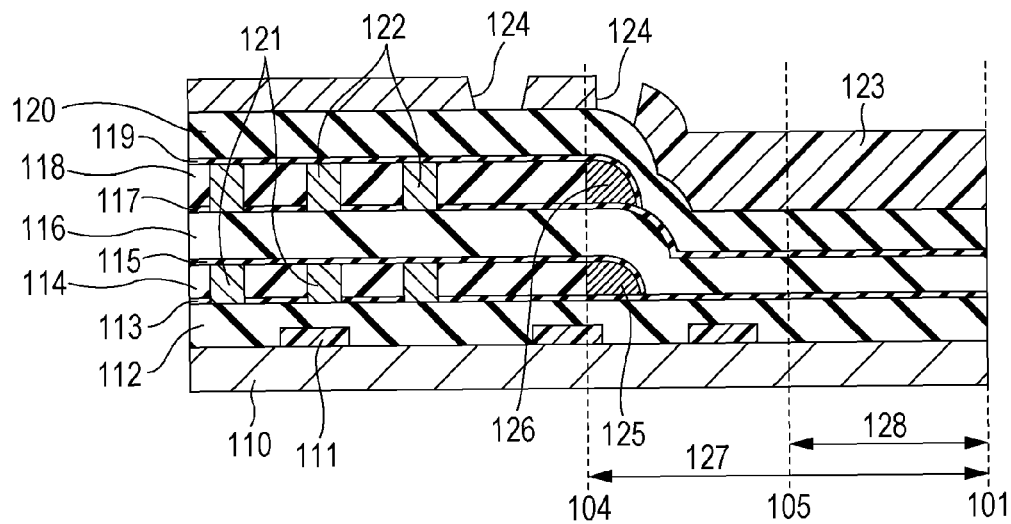
FIG. 1C is a cross sectional schematic view of the wafer for describing Example 1.

Next, the subject of the invention is described with reference to FIG. 1C. FIG. 1C is a cross-sectional schematic view along the IC-IC line of FIG. 1B. An element (not illustrated) is formed on a semiconductor substrate 110 of FIG. 1C. Herein, the semiconductor substrate 110 refers to a part of a semiconductor wafer. When referred to as a semiconductor substrate, the semiconductor substrate sometimes refers to both a substrate which is a wafer as it is and a substrate completed as a semiconductor device obtained by separating a wafer into pieces by dicing or the like.

On the semiconductor substrate, conductive patterns 111 constituting a gate of a transistor, a plurality of insulation films, conductive patterns forming wiring layers disposed above the conductive patterns constituting a gate are disposed, for example. In this example, two layers of a first wiring layer 121 and a second wiring layer 122 are provided as the wiring layer and the conductive patterns constituting the wiring layers are illustrated. The conductive patterns 111 constituting a gate contain polysilicon, for example. Each wiring layer has a plurality of wiring which are electrically independent from each other, i.e., a plurality of independent conductive patterns. Herein, the conductive patterns constituting the wiring layers contain copper as the main component, for example.

The plurality of insulation films include insulation films 112 to 120 and are constituted by alternately laminating an insulation film containing silicon oxide and an insulation film containing nitride silicon. The plurality of insulation films have insulation films surrounding at least the side surfaces of the conductive patterns. Herein, in the conductive patterns constituting the first wiring layers 121, the side surfaces are surrounded by the insulation film 114 and the insulation film 113. In the conductive patterns constituting the second wiring layers 122, the side surfaces are surrounded by the insulation film 118 and the insulation film 117. The insulation films surrounding the side surfaces of the conductive patterns constituting the wiring layers are referred to as a first insulation film. Mentioned as an example of the first insulation film is one having grooves (an opening or a concave portion) for providing the conductive patterns as in a damascene structure. Specifically, in FIG. 1C, the first insulation film refers to the insulation film 113 and the insulation film 114 in which the conductive patterns of the first wiring layers 121 are disposed in the grooves. Moreover, the first insulation film refers to the insulation film 117 and the insulation film 118 in which the conductive patterns of the second wiring layers 122 are disposed in the grooves. More specifically, the first insulation film on which the wiring layers are disposed may be a single layer or a plurality of layers. Such a configuration can be formed by a single damascene method or a dual damascene method. Herein, the upper surface of the conductive patterns of the first wiring layers 121 are in contact with the upper surface of the insulation film 114 and the upper surface of the conductive patterns of the second wiring layers 122 are in contact with the upper surface of the insulation film 118.

The outer edge 104 of a region where the insulation films surrounding the side surfaces of the conductive patterns of the wiring layers are formed refers to an outer edge of a region where films to be used when forming the insulation films are formed. The insulation films are positioned from the center 10 of the wafer to the outer edge 104. The first insulation films are not disposed or removed in a region outside the outer edge 104. In FIG. 1C, the insulation films 113, 114, 117, and 118 are not disposed outside the outer edge 104 of the region where the insulation films in which the wiring layers are disposed are formed. The insulation films 113, 114, 117, and 118 are disposed from the center 10 (not illustrated) of the wafer to the outer edge 104.

The outer edge 105 of the region where the conductive patterns can be formed refers to an outer edge of a region where conductive films for use in the formation of the conductive patterns are formed. When forming the conductive patterns, a conductor is formed on the entire surface, and thereafter the conductor formed in a portion apart from the circumference 101 with a fixed distance is subjected to rinse treatment to be removed. The outer edge 105 refers to an outer edge of a region where the conductors which are not removed by the rinse treatment are disposed. The conductors are positioned from the center 10 of the wafer to the outer edge 105. The outer edge 105 can also be referred to as the outer edge of a region which is subjected to removal treatment of the conductor, e.g., removal or planarization by Chemical Mechanical Polishing (hereinafter referred to as CMP), and the conductive patterns can be formed.

In FIG. 1C, the outer edge 104 is located at a position apart from the circumference 101 of the wafer by an interval 127. The outer edge 105 is located at a position apart from the circumference 101 of the wafer by an interval 128 and is located between the outer edge 104 and the circumference 101. The interval 128 is narrower than the interval 127. When the outer edge 104 and the outer edge 105 are in such a positional relationship, unnecessary conductive patterns 125 are formed when removing the conductor arranged to the outer edge 105 and forming the conductive patterns. The unnecessary conductive patterns 125 are formed on a step difference of the first insulation films produced at the outer edge 104.

In the state of having such unnecessary conductive patterns 125 and 126, at least some regions of the plurality of insulation films are removed in such a manner as to penetrate the plurality of insulation films to form openings in order to form an optical waveguide, for example. In the case of an optical waveguide, a region corresponding to photoelectric conversion portions of the insulation films is mentioned. A mask 123 contains photoresist, for example, and has openings 124 corresponding to some regions. Hereinafter, the reference numeral designating the openings in the drawings represents the side wall of the openings. Exposure for forming the mask 123 of photoresist is performed by exposure having the exposure region 103 as illustrated in FIG. 1A. Herein, the openings 124 of the mask 123 are partially disposed above the unnecessary conductive patterns 125 and 126. When etching is performed in order to partially remove the insulation films in such a state, the unnecessary conductive patterns 125 and 126 are exposed and etched. Since the unnecessary conductive patterns 125 and 126 contain metal containing copper as the main component, for example, the metal scatters due to etching to contaminate the inside of an etching device or to the wafer to contaminate the wafer. When the inside of the etching device is contaminated, metal contamination may occur in the wafer in a process not relating to metal in some cases. Such metal contamination in a semiconductor device causes the generation an unusual signal and, particularly in an image pick-up device, white patches are formed to deteriorate the image quality. In contrast, the occurrence of the metal contamination can be suppressed according to a manufacturing method of this example described below. The conductive patterns include a pattern constituting a wiring layer and an unnecessary pattern (unnecessary conductive pattern).

Figure 2A:
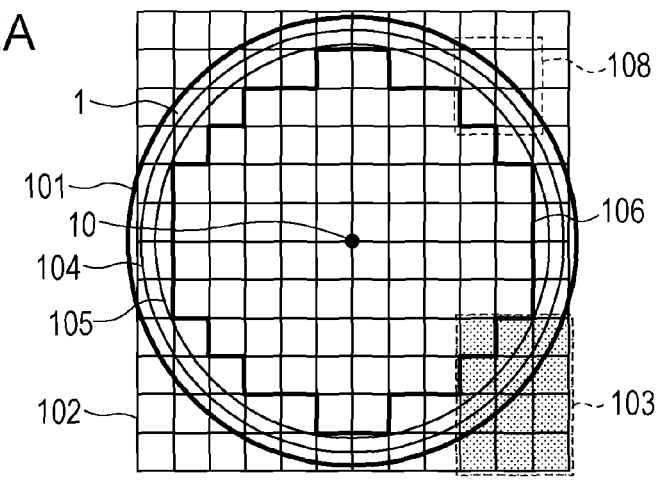
FIG. 2A is a plan schematic view of the wafer of Example 1.
Figure 2B:
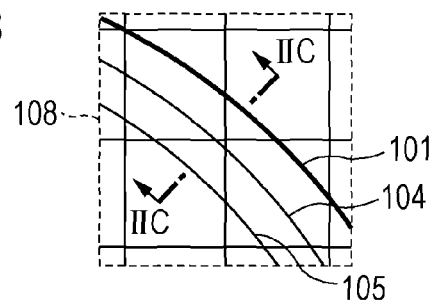
FIG. 2B is a plan schematic view of the wafer of Example 1.
Figure 2C:
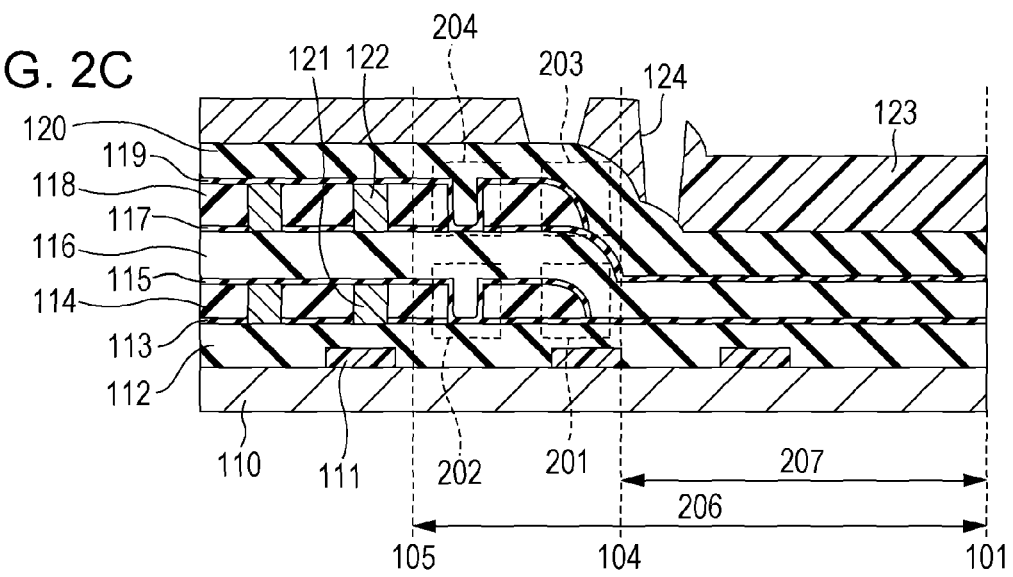
FIG. 2C is a cross sectional schematic view of the wafer for describing Example 1.

Hereinafter, this example is described with reference to FIGS. 2A to 2C. FIGS. 2A to 2C are views corresponding to FIGS. 1A to 1C. The same configurations are designated by the same reference numerals and the description thereof is omitted. FIG. 2A is a plan schematic view of a semiconductor wafer 1 and an exposure region and corresponds to FIG. 1A. FIG. 2B is a view in which a noticeable region 108 of FIG. 2A is enlarged and corresponds to FIG. 1B.

FIG. 2A is different from FIG. 1A in the positional relationship of the outer edge 104 and the outer edge 105. Specifically, the outer edge 104 is closer to the circumference 101 of the wafer than the outer edge 105. This Example is specifically described with reference to FIG. 2C.

FIG. 2C is a cross-sectional schematic view along the IIC-IIC line of FIG. 2B and corresponds to FIG. 1C. The description of the same configurations as those of FIG. 1C is omitted. FIG. 2C is different from FIG. 1C in the positions of the outer edge 105 and the outer edge 104 and regions 201 to 204 where insulation films are disposed.

The outer edge 104 is located at a position (second position) apart from the circumference 101 of the wafer by an interval 207. The outer edge 105 is located at a position (first position) apart from the circumference 101 of the wafer by an interval 206. The interval 207 is narrower than the interval 206 and the outer edge 104 is located between the outer edge 105 and the circumference 101. More specifically, the second position is closer to the circumference 101 of the wafer than the first position. Due to the arrangement relationship, although the conductive patterns are disposed in FIG. 1C in the openings of the first insulation films, regions 202 and 204 where conductive patterns are not disposed and only insulation films are disposed are formed in FIG. 2C. Due to the fact that the outer edge 104 is located between the outer edge 105 and the circumference 101, an unnecessary conductive pattern is not formed on a step difference of the first insulation films produced at the outer edge 104. Therefore, the unnecessary conductive patterns 125 and 126 of FIG. 1C is not formed in the regions 201 and 203 of FIG. 2C and only the insulation films are disposed. Due to such a configuration, when performing etching in order to partially remove the insulation films using a mask 123, the occurrence of metal contamination can be suppressed because there is no unnecessary conductive pattern. Due to the fact that the second position is closer to the circumference 101 of the wafer than the first position, the first insulation film is disposed to a position closer to the circumference of the wafer than a position closest to the circumference of the wafer among the arrangement positions of the conductive patterns to be formed.

Next, a method for manufacturing a solid-state image pickup device of this example is described with reference to FIG. 3A to FIG. 6C. FIG. 3A to FIG. 6C are cross-sectional schematic views corresponding to FIG. 2C. The same configurations are designated by the same reference numerals and the description thereof is omitted. Moreover, a detailed description of a configuration which can be manufactured by general semiconductor techniques is omitted.

Figure 3A:
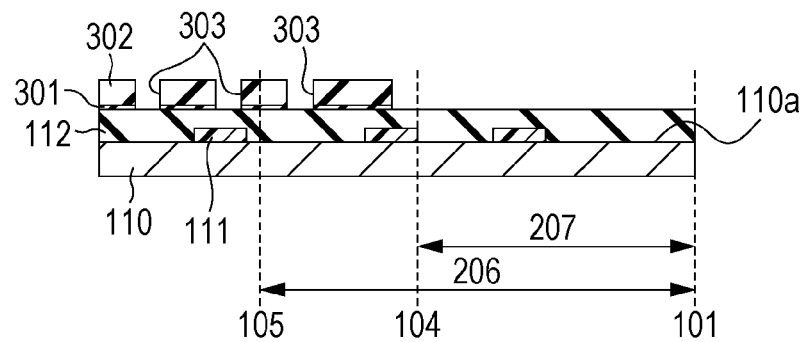
FIG. 3A, FIG. 3B, FIG. 3C, and FIG. 3D are cross-sectional schematic views for describing a manufacturing method of Example 1.

First, as illustrated in FIG. 3A, the insulation film 112 covering the first conductive patterns 111 constituting a gate electrode is formed. The insulation film 112 is, for example, BPSG or silicon oxide. On the insulation film 112, a contact (not illustrated) is formed. On the insulation film 112, a two-layer insulation film is formed, for example. Specifically, nitride silicon and silicon oxide are laminated in the stated order for the formation thereof. The insulation film containing nitride silicon has film thickness smaller than that of an insulation film containing silicon oxide. The two-layer insulation film outside the outer edge 104 is removed using a photolithographic technique and an etching technique. Then, the two-layer insulation film in regions of a wiring layer where the conductive patterns are to be formed is removed to form openings 303. The insulation film containing nitride silicon is formed into an insulation film 301 having the openings 303. The insulation film containing silicon oxide is formed into an insulation film 302 having the openings 303. Later, the insulation film 301 and the insulation film 302 form a first insulation film. Herein, the removal of the insulation film outside the outer edge 104 and the formation of the openings are performed in other processes but may be performed in one process.

Figure 3B:
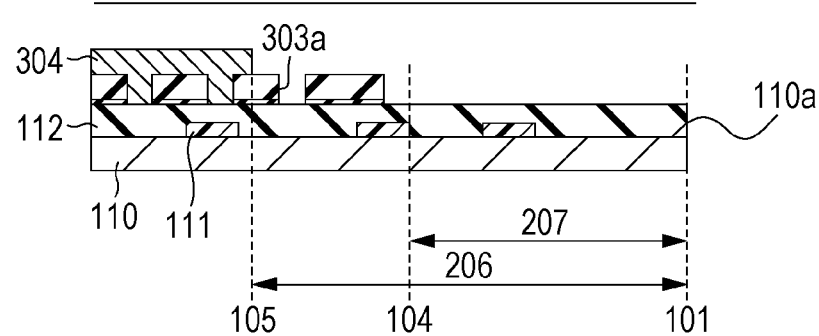
Figure 3C:
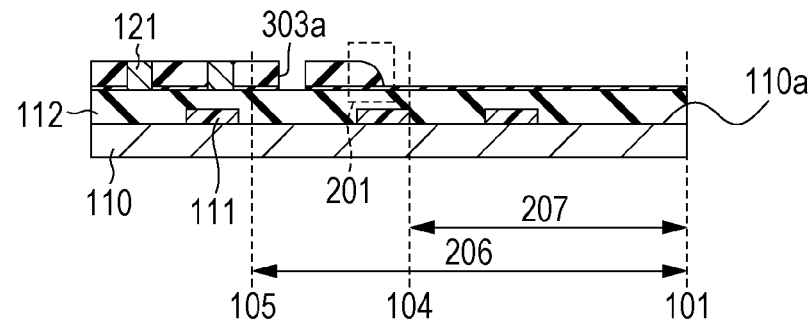

Then, the conductive patterns constituting the wiring layer are formed. First, copper is formed as a conductor by plating on a principal surface 110a of a semiconductor substrate 110. Next, rinse treatment is performed to remove the copper formed in a region from the circumference 101 of the wafer to the outer edge 105 is removed to form a conductor 304 (FIG. 3B). In the rinse treatment, the copper is removed using a fluorine solution. Thereafter, the conductor 304 is removed and planarized by a CMP method, and a conductive pattern is formed from the conductor 304, thereby forming first wiring layers 121 (FIG. 3C). In this case, end portions (at the side of the outer edge 104) of the insulation film 301 and the insulation film 302 are ground to form the insulation films 113 and 114. The conductive pattern is not formed in a part of the openings 303 (303a) formed outside the outer edge 105, and the opening 303 remains as an opening 303a. The conductive pattern is not disposed in the vicinity of the outer edge 104, and only the insulation film is disposed in the region 201.

Figure 3D:
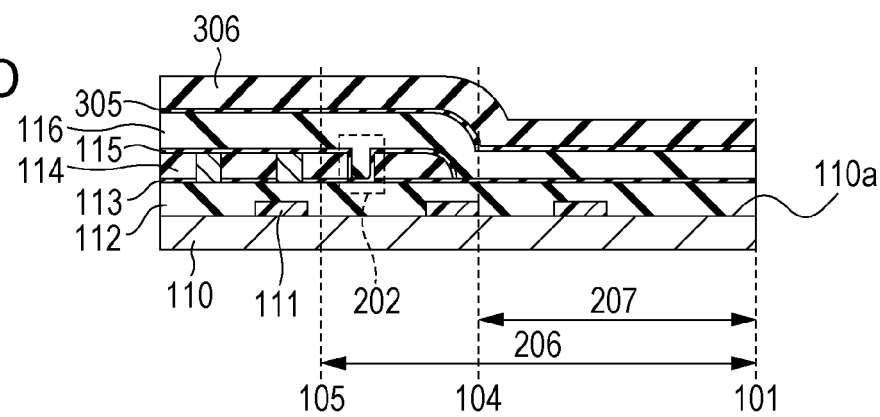

Next, as illustrated in FIG. 3D, insulation films 115, 116, 305, and 306 are formed above the insulation film 114. Herein, the opening 303a is filled with the insulation films 115 and 116 to form a region 202 containing only the insulation films. Herein, the insulation film 115 and the insulation film 305 contain nitride silicon, for example. The insulation film 116 and the insulation film 306 contain silicon oxide, for example. The insulation film containing nitride silicon has film thickness smaller than that of the insulation film containing silicon oxide.

Figure 4A:
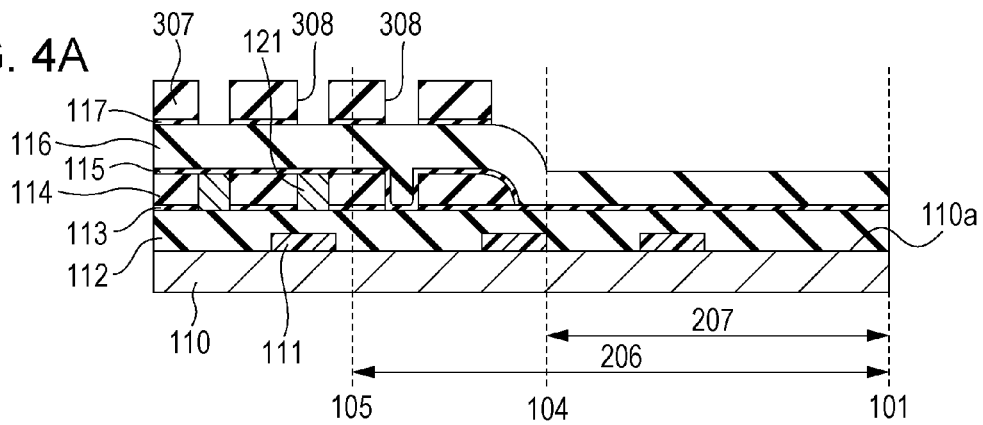
FIG. 4A, FIG. 4B, and FIG. 4C are cross-sectional schematic views for describing the manufacturing method of Example 1.
Figure 4B:
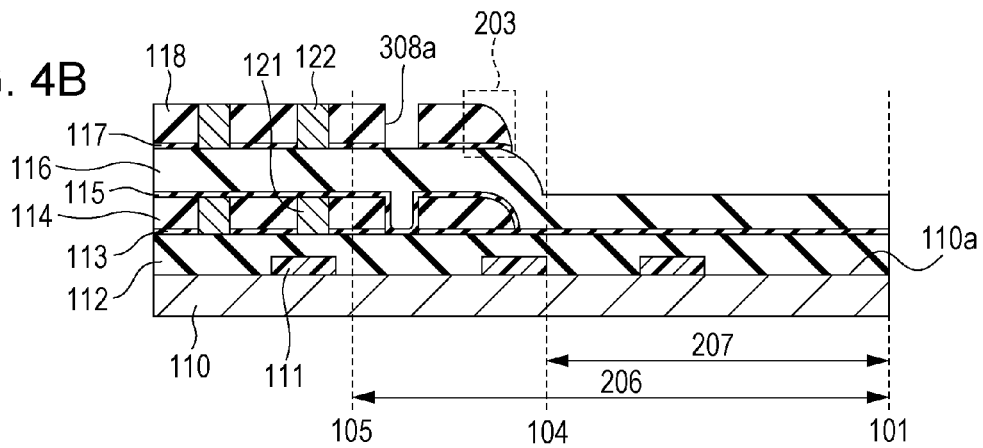

As illustrated in FIG. 4A, the insulation film 305 and the insulation film 306 outside the outer edge 104 are removed to form openings 308. The insulation film 305 forms an insulation film 117 having the openings 308. Thereafter, as illustrated in FIG. 4B, second wiring layers 122 are formed. Similarly as in FIG. 3B and FIG. 3C, conductive patterns of the second wiring layers 122 are formed by forming a conductor to the outer edge 105, and then planarizing the conductor by a CMP method. Herein, the insulation film 307 is partially removed by a CMP method to form an insulation film 118. The conductive pattern is not formed in an opening 308a disposed outside the outer edge 105. The conductor is not disposed in the vicinity of the outer edge 104, and only the insulation films are disposed in a region 203.

Figure 4C:
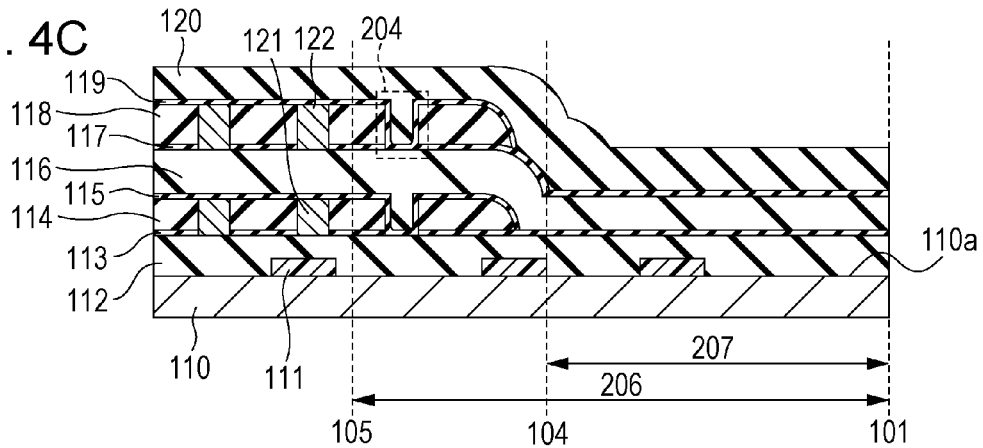

Next, an insulation film 119 and an insulation film 120 are formed (FIG. 4C). The insulation film 119 contains nitride silicon, for example and the insulation film 120 contains silicon oxide, for example. The insulation film 119 containing nitride silicon has film thickness smaller than that of the insulation film 120 containing silicon oxide. The opening 308a forms a region 204 filled with the insulation film 119 and the insulation film 120. A wafer having the structure of FIG. 4C may be prepared, and the following processes may be performed.

Figure 5A:
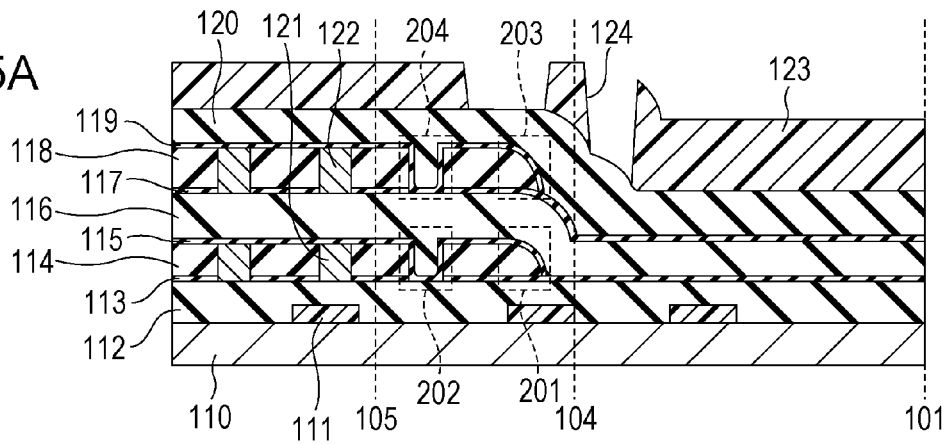
FIG. 5A, FIG. 5B, and FIG. 5C are cross-sectional schematic views for describing the manufacturing method of Example 1.
Figure 5B:
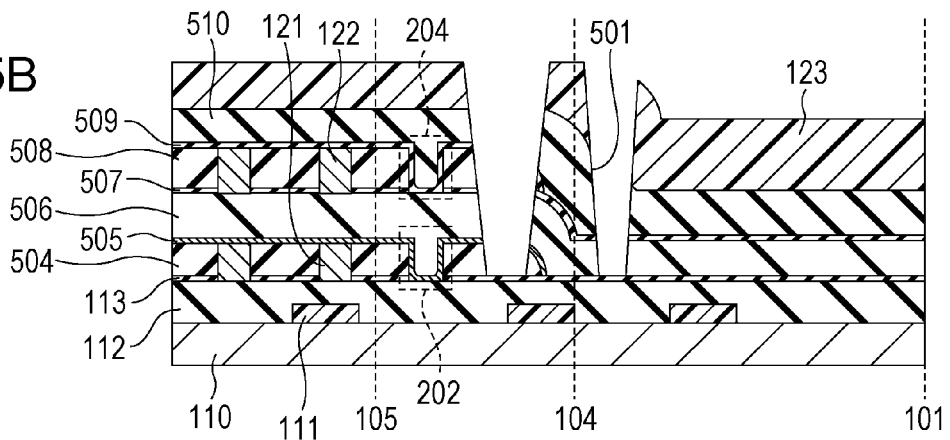

Then, a mask 123 containing photoresist illustrated in FIG. 5A is formed on the insulation film 120. FIG. 5A has the same configuration as that of FIG. 2C. Then, the insulation films in regions corresponding to the openings 124 of the plurality of insulation films are removed using the mask 123 having the openings 124. The removal is performed by performing anisotropic etching to the insulation films, for example. Specifically, plasma etching using a fluorocarbon gas, such as $C_4F_6$, oxygen, and inactive gas, such as argon, is performed. Herein, the plurality of insulation films may be all removed or only some of them may be removed. In this example, as illustrated in FIG. 5B, the insulation film 112 and the insulation film 113 are not removed and some of the insulation films are removed to form openings 501 in the region 201 and the region 203. The openings may be formed to reach at least the height lower than the height at which a top conductive pattern is disposed. The plurality of insulation films 112 to 120 form a plurality of insulation films 112, 113, and 504 to 510 having the openings 501.

Figure 5C:
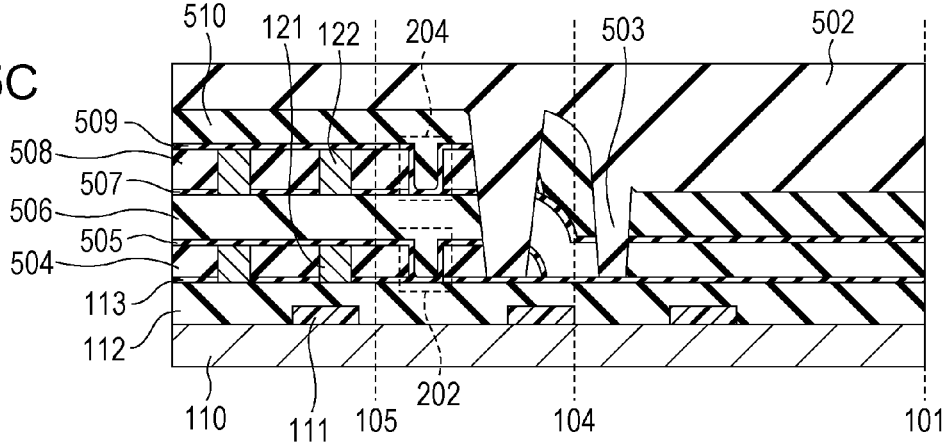

After removing the mask 123, the openings 501 are filled with a high refractive index material whose refractive index is higher than that of the plurality of insulation films to form a high refractive-index film 502 illustrated in FIG. 5C. The high refractive-index film 502 is formed by filling the openings 501 with a high refractive-index material, and performing planarization treatment. Herein, nitride silicon is deposited by high-density plasma CVD (Chemical Vapor Deposition)

and is planarized by a CMP method. Regions 503 buried in the openings 501 constitute a plurality of insulation films and an optical waveguide.

Herein, the plurality of insulation films contain an insulation film mainly containing silicon oxide and an insulation film containing nitride silicon. In this example, the insulation film containing nitride silicon is thinner than the insulation film containing silicon oxide and the proportion thereof is low at the side surface of the openings. Therefore, in this example, the plurality of insulation films are considered to be insulation films containing silicon oxide. Therefore, the high refractive-index material may be a material whose refractive index is higher than the refractive index (about 1.35 to 1.54) of silicon oxide, and nitride silicon, oxynitride silicon, and high refractive-index resin, such as polyimide, can be used. The refractive index of nitride silicon is about 1.75 to 2.34 and the refractive index of oxynitride silicon is a value between that of silicon oxide and that of nitride silicon. In this example, the high refractive-index material is supposed to be nitride silicon.

Figure 6A:
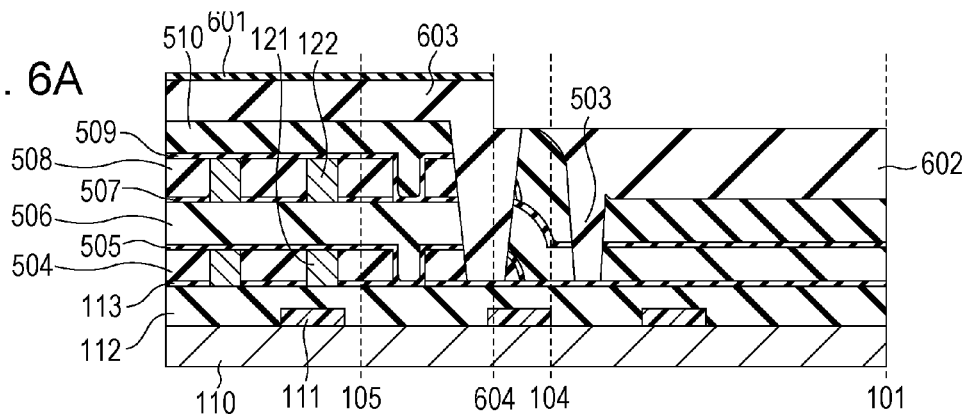
FIG. 6A, FIG. 6B, and FIG. 6C are cross-sectional schematic views for describing the manufacturing method of Example 1.

Next, an insulation film containing oxynitride silicon is formed on the high refractive-index film 502. The high refractive-index film outside an outer edge 604 of the high refractive-index film is partially removed, and a high refractive-index film 603, a high refractive-index film 602, and an insulation film 601 containing oxynitride silicon are formed (FIG. 6A). Since the first insulation film is not disposed in a region outside the outer edge 104, the high refractive-index material is thickly deposited. In general, since the high refractive-index material has high stress, crack or separation may be caused when a thick film is formed. Therefore, by disposing the outer edge 604 of the high refractive-index film at a position (third position) inside the outer edge 104 of the first insulation film, the thickness of the high refractive-index film can be reduced, so that the occurrence of cracking or separation can be suppressed.

Figure 6B:
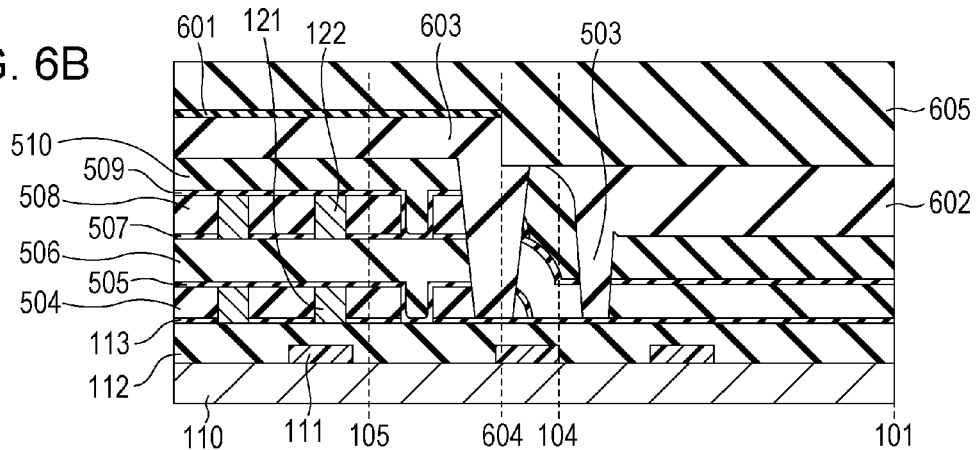

Then, in FIG. 6B, silicon oxide is deposited by a plasma CVD to form an insulation film 605. The upper surface of the insulation film 605 is planarized to be flat. Then, a lens layer 606 having a lens 607 is formed on the insulation film 605. The lens layer 606 contains nitride silicon, for example. As in this example, oxynitride silicon films may be disposed on the upper and lower surfaces of the lens layer 606. Furthermore, an arbitrary configuration such as a planarization layer containing resin, a color filter layer, and another lens layer, may be formed on the lens layer 606. Thereafter, in order to divide the wafer into solid-state image pick-up devices, the wafer illustrated in FIG. 2A is subjected to dicing treatment, thereby obtaining a plurality of semiconductor devices, herein solid-state image pick-up devices.

As described above, by disposing the outer edge 104 of the first insulation film on which the wiring layers are disposed at the side of the circumference 101 of the wafer relative to the outer edge 105 on which the conductor is formed, the process of removing the plurality of insulation films can be performed while suppressing metal contamination. Moreover, according to the wafer of this example, a high quality semiconductor device in which metal contamination is reduced can be provided. Particularly among semiconductor devices, the invention is suitable in a solid-state image pick-up device in which a reduction of metal contamination is expected.

A reason for forming the conductive pattern, the first insulation film, or the like even in a region where a semiconductor device cannot be formed resides in increasing the uniformity of the wafer in a subsequent planarization process or the like. Particularly in this example, the case where the region containing the plurality of semiconductor devices is exposed by one exposure is described. However, the invention can also be applied to a case where a region containing only one semiconductor device is exposed by one exposure. Materials can be changed as appropriate and, for example, nitride silicon can be replaced by silicon carbide or the like and copper can be replaced by another conductor material, such as aluminum or tungsten.

EXAMPLE 2

Figure 7A:
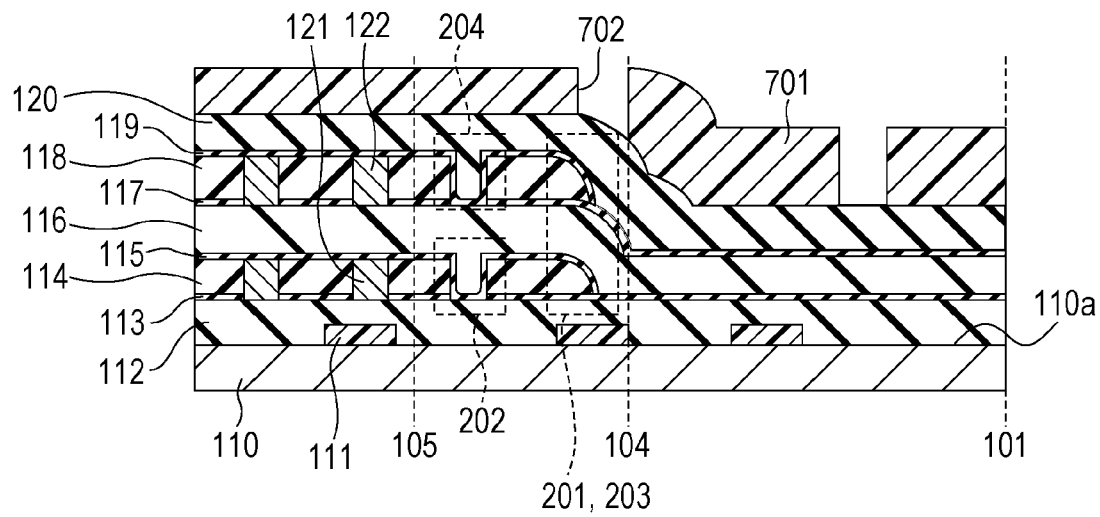
FIG. 7A and FIG. 7B are cross-sectional schematic views for describing a manufacturing method of Example 2.
Figure 7B:
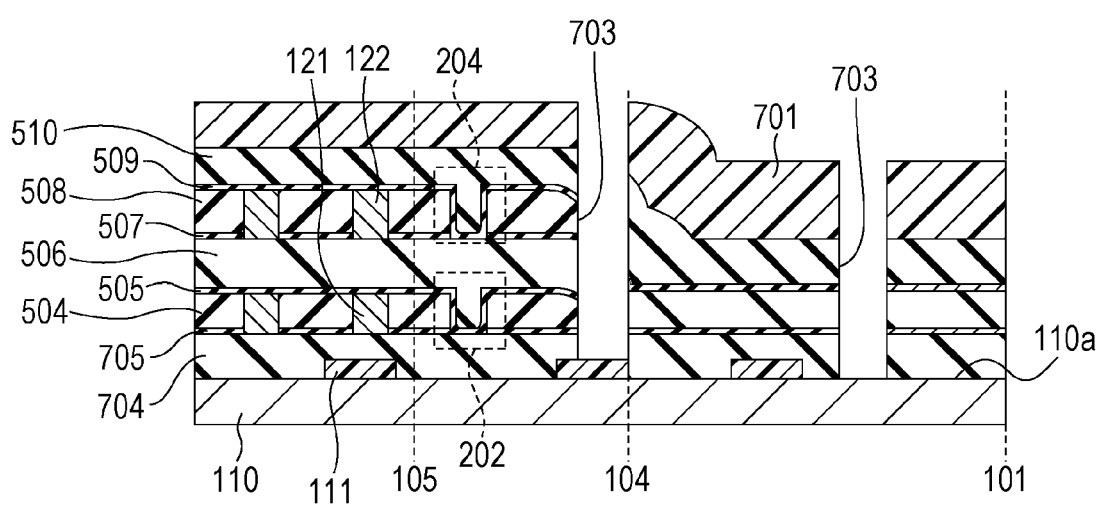

This Example is described with reference to FIGS. 7A and 7B. Example 2 is different from Example 1 in that this example has a configuration in which an optical waveguide is not provided and a through hole via is provided and other configurations are the same as those of Example 1. FIG. 7A and FIG. 7B of this example illustrate a configuration corresponding to FIG. 5A and FIG. 5B of Example 1. The same configurations are designated by the same reference numerals and the description thereof is omitted.

In FIG. 7A, a mask 701 containing photoresist is provided. The mask 701 can be formed by exposure in the exposure region 103 illustrated in FIG. 2A of Example 1. The mask 701 has openings 702 for a through hole via or a through hole electrode. The through hole via or the through hole electrode contains a conductor formed by penetrating a plurality of insulation films and is used for connecting an external pad portion to which an external terminal is connected and a semiconductor substrate 110, for example. Etching for removing the plurality of insulation films is performed using the mask 701 of FIG. 7A to form openings 703 in the plurality of insulation films. The plurality of insulation films 112 to 120 form a plurality of insulation films 704, 705, and 504 to 510 having the openings 703. Herein, since a conductor is not disposed under the openings 702 of the mask 701 similarly as in Example 1, a possibility that metal contamination occurs can be reduced even when etching is performed. Thereafter, by forming conductors for covering and burying the openings 703 and removing unnecessary portions, a through hole via or a through hole electrode can be formed.

As described above, also in the process of forming the through hole via or the through hole electrode as in this example, the occurrence of metal contamination can be reduced. Moreover, this example is not limited to solid-state image pick-up devices and can also be applied to general semiconductor devices. Furthermore, a configuration having both an optical waveguide and a through hole via can be obtained by combining with Example 1 as appropriate.

EXAMPLE 3

This example is described with reference to FIGS. 8A to 8D. This example describes a configuration when wiring is further added to the configuration of Example 1 and other configurations are the same as those of Example 1. FIG. 8A to FIG. 8D of this example are cross sectional views for describing a manufacturing method continuous to FIG. 6A of Example 1. The same configurations as those of FIG. 6A are designated by the same reference numerals and the description thereof is omitted.

Figure 8A:
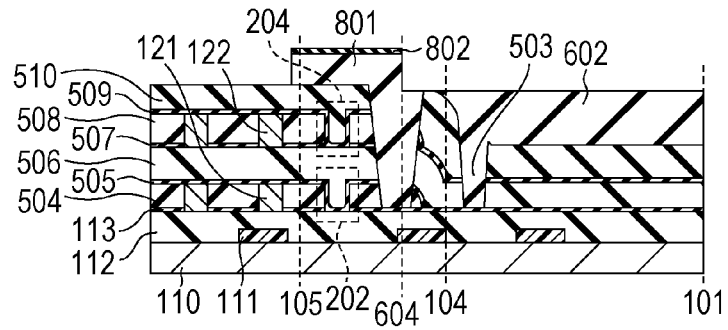
FIG. 8A, FIG. 8B, FIG. 8C, and FIG. 8D are cross-sectional schematic views for describing a manufacturing method of Example 3.
Figure 8B:
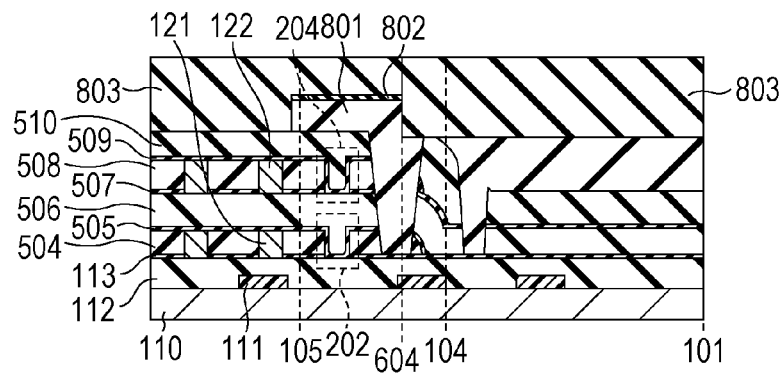
Figure 8C:
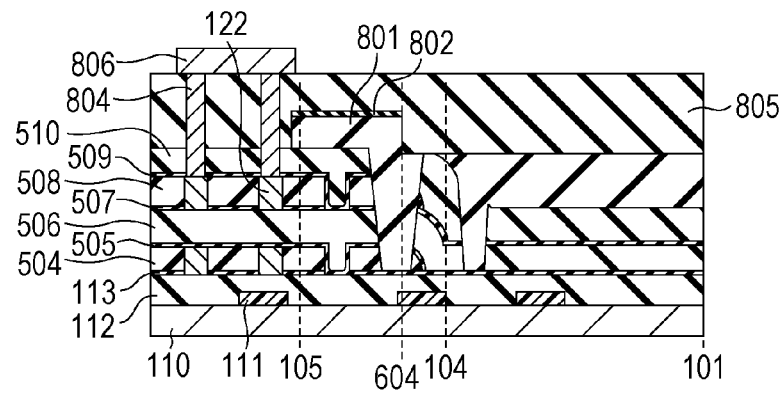

The insulation film 601 and the high refractive-index film 603 of FIG. 6A are partially removed to form a high refractive-index film 801 and an insulation film 802 (FIG. 8A). Then, an insulation film 803 containing silicon oxide, for example, is formed. The insulation film 803 buries the high refractive-index film 801 and the insulation film 802 and has a flat upper surface which has been subjected to planarization treatment (FIG. 8B). Then, openings are formed in the insulation film 803 and plugs 804 are formed. The insulation film 803 forms an insulation film 805. A third wiring layer 806 is formed above the plugs 804 and on the insulation film 805. Herein, the third wiring layer 806 contains a conductor containing aluminum as the main component and is formed by patterning a conductor film.

Figure 6C:
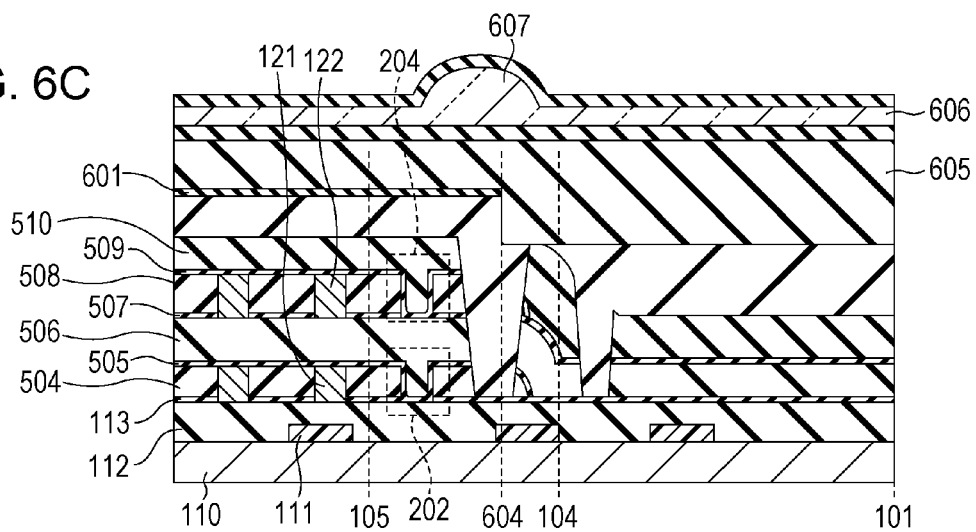
Figure 8D:
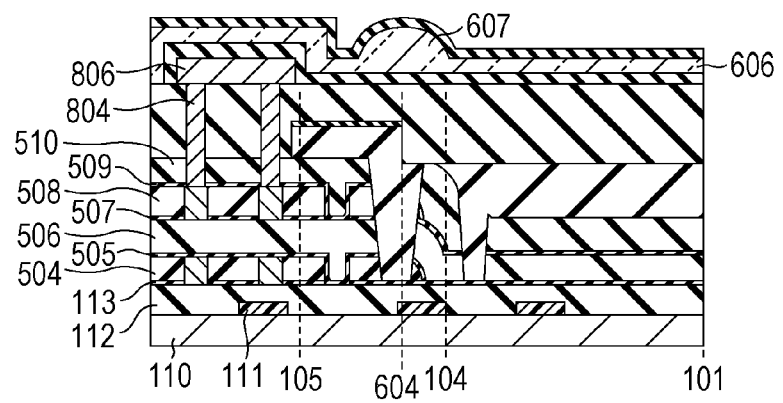

Thereafter, a lens layer 606 having a lens 607 is formed similarly as in FIG. 6C. Oxynitride silicon films are disposed on the upper and lower surfaces of the lens layer 606. Thus, the configuration of FIG. 8D is obtained. Furthermore, an arbitrary configuration, such as a planarization layer containing resin, a color filter layer, another lens layer, may be formed on the lens layer 606. As described above, a solid-state image pick-up device can be formed.

As in this example, a wiring layer may have a plurality of layers. Also in the configuration of this example, the occurrence of metal contamination can be reduced.

EXAMPLE 4

Figure 9:
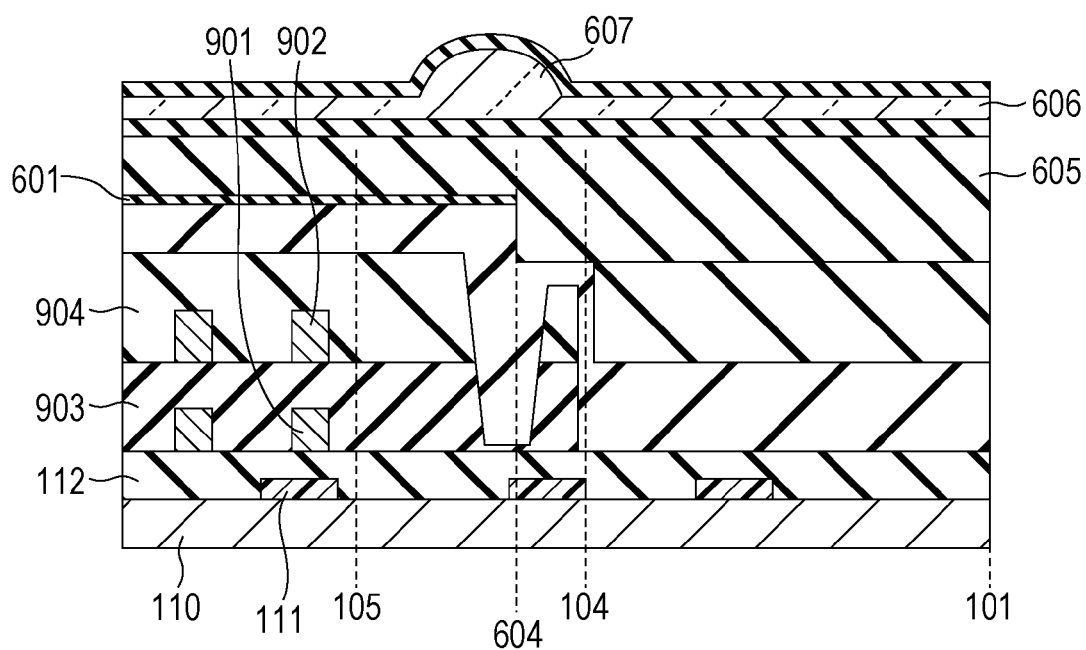
FIG. 9 is a cross-sectional schematic view for describing a manufacturing method of Example 4.

This example is different from Example 1 in the structure of a first wiring layer and a second wiring layer and other configurations are the same as those of Example 1. In accordance therewith, the configuration of an insulation film equivalent to the first insulation film is different. Hereinafter, this example is described with reference to FIG. 9. FIG. 9 of this example is a cross sectional view corresponding to FIG. 6C of Example 1. The same configurations as those of FIG. 6C are designated by the same reference numerals and the description thereof is omitted.

In FIG. 9, conductive patterns of first wiring layers 901 are formed by patterning a conductor film. The undersurface thereof is in line with the undersurface of an insulation film 903 and the upper surface is covered with the insulation film 903. Moreover, conductive patterns of second wiring layers 902 are formed by patterning a conductor film. The undersurface thereof is in line with the undersurface of an insulation film 904 and the upper surface is covered with the insulation film 904. Herein, the conductive patterns of the first wiring layers 901 or the second wiring layers 902 are surrounded by the insulation film 903 or the insulation film 904, and it can be said that the layers are disposed in concave portions of the insulation film 903 or the insulation film 904. More specifically, the insulation film 903 and the insulation film 904 are equivalent to the first insulation film.

Also in this example, similarly as in Example 1, an outer edge 104 of a region where a first insulation film is formed is closer to a circumference 101 of a wafer than an outer edge 105 of a region where conductors are formed and is closer to the circumference 101 of the wafer than an outer edge 604 of a high refractive-index film. Due to such a configuration, an optical waveguide can be formed while suppressing the occurrence of metal contamination.

The first wiring layer and the second wiring layer contain metal containing aluminum as the main component in this example, and the wiring layers can be formed from another conductor.

Moreover, in the second wiring layer 902, the first insulation film can be the insulation film 903, for example. This is because when the outer edge 104 of a region where the first insulation film is formed is further from the circumference 101 of the wafer than the outer edge 105 of a region where the conductors are formed, an unnecessary conductive pattern is sometimes formed on a step difference of the first insulation film when forming the second wiring layer 902. Also in this case, the outer edge 104 of the region where the first insulation film is formed may be closer to the circumference 101 of the wafer than the outer edge 105 of the region where the conductors are formed.

EXAMPLE 5

This example is described with reference to FIG. 11 to FIG. 14D taking a solid-state imaging apparatus as an example of a semiconductor device. In this example, the same configurations as those of other examples are designated by the same reference numerals and the description thereof is omitted.

This example aims at reducing contamination due to scattering of not copper of a wiring layer but metal constituting a silicide region, for example. When forming an opening in which a portion where a silicide region is exposed, such as a contact hole, metal constituting the silicide region may scatter to cause metal contamination. Particularly in a solid-state image pick-up device, the metal contamination has significant influence on the image quality. Therefore, for example, measures, such as separately performing the formation of a contact hole which exposes a portion having a silicide region and the formation of a contact hole which exposes a portion not having a silicide region, are taken when forming the contact hole. However, when the silicide region is formed at an unexpected portion similarly as in Example 1 and the like, the silicide region is exposed during the formation of the contact hole which exposes the portion not having the silicide region, which results in the occurrence of metal contamination. This example aims at reducing the contamination due to the scattering thereof.

Figure 11:
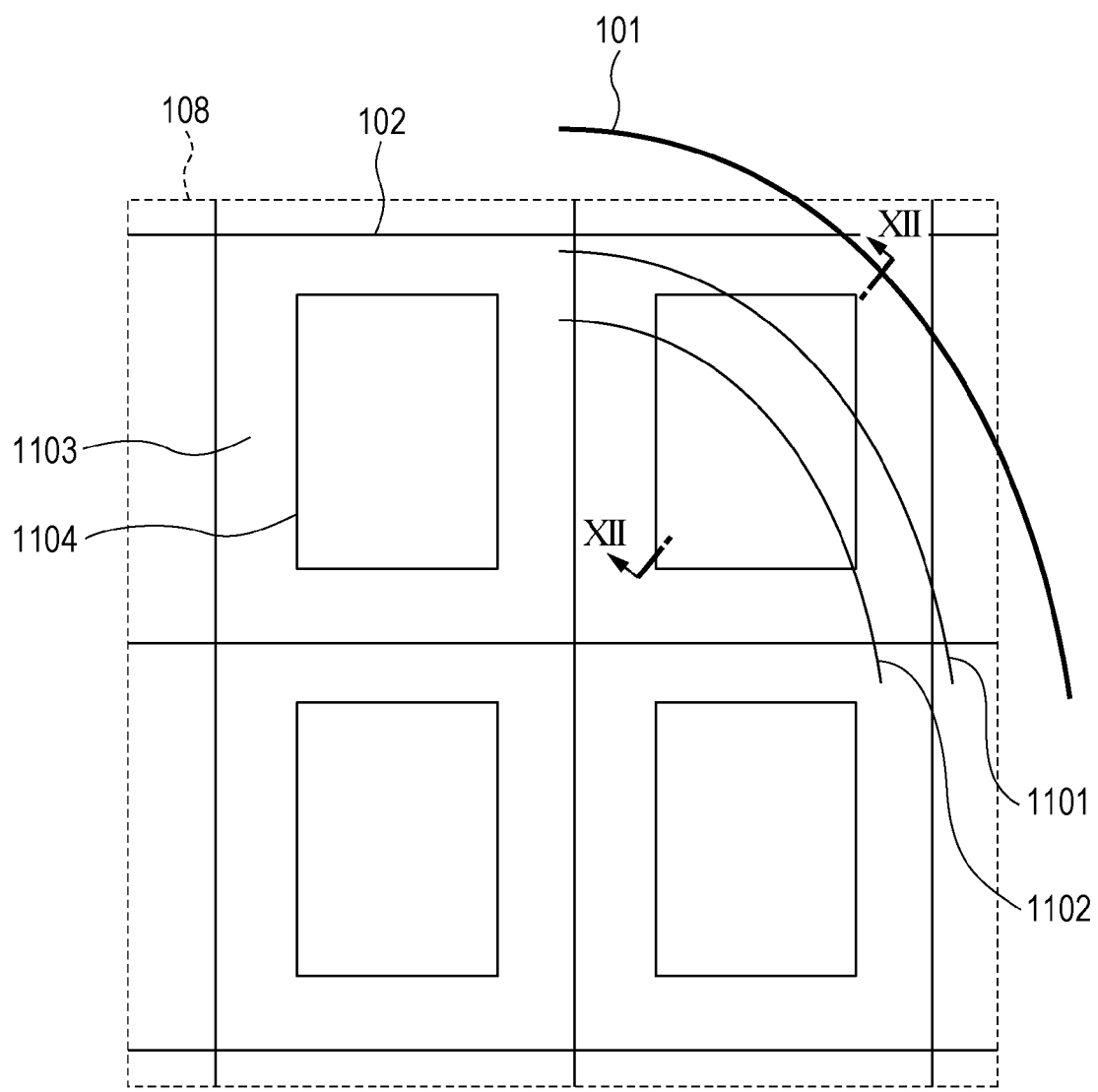
FIG. 11 is a plan schematic view of a wafer for describing Example 5.

FIG. 11 is a plan schematic view of a wafer 1. FIG. 11 corresponds to FIG. 2B although the arrangement of semiconductor devices on the wafer 1 is different from that of FIG. 2A and FIG. 2B of Example 1. In this example, a pixel region 1104 and a peripheral region 1103 thereof are illustrated in the range of a semiconductor device.

In FIG. 11, an outer edge 1102 of a region where a metal film (conductor) for forming the silicide region is formed is further from a circumference 101 of a wafer than an outer edge 1101 of a preventive layer (first insulation film) for preventing the formation of the silicide region. More specifically, the outer edge 1102 is located at a position (second position) apart from the circumference 101 of the wafer by a second interval and the outer edge 1101 is located at a position (first position) apart from the circumference 101 of the wafer by a first interval. The first interval is smaller the second interval. The interval can also be referred to as a length. Such a configuration can suppress unexpected exposure of the silicide region during the formation of the contact hole which exposes the portion not having the silicide region. Hereinafter, the outer edge 1102 of the region where the metal film (conductor portion) for forming the silicide region is formed is referred to as the outer edge 1102 of the silicide region.

Figure 12:
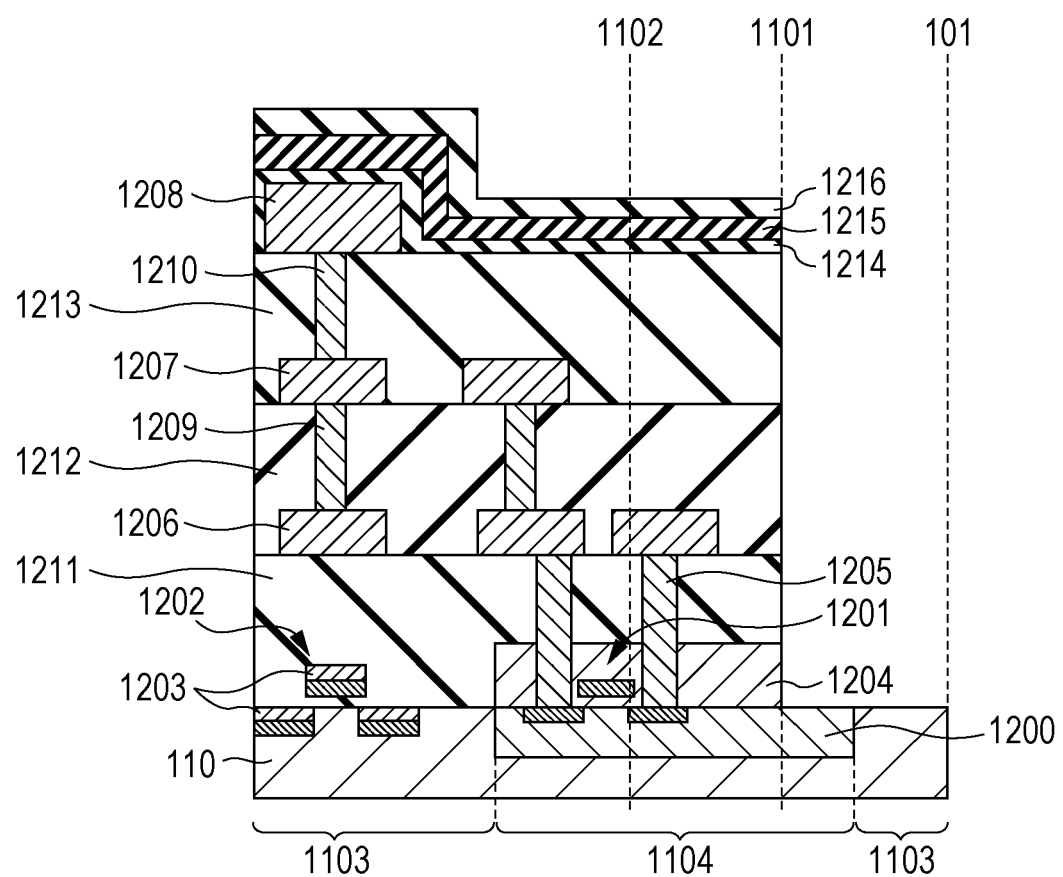
FIG. 12 is a cross-sectional schematic view of the wafer for describing Example 5.

Such a configuration is further described with reference to FIG. 12. FIG. 12 is a cross-sectional schematic view of a wafer along the XII-XII line of FIG. 11 and schematically illustrates the cross section of a wafer during manufacturing of a semiconductor device. FIG. 12 is a schematic view in which a semiconductor region or various elements is/are omitted for simple description.

First, in the pixel region 1104, a well 1200 and an MOS transistor 1201 are provided on a semiconductor substrate 110. A preventive layer 1204 is provided covering the MOS transistor 1201. Due to the preventive layer 1204, no silicide region is formed on the MOS transistor 1201. The preventive layer 1204 is formed to the outer edge 1101. An MOS transistor 1202 is provided on the semiconductor substrate 110 in a part of the peripheral region 1103. A silicide region 1203 is formed on a gate electrode and a source region and a drain region of the MOS transistor 1202. In this example, a portion having the silicide region 1203 has a configuration equal to that of the peripheral region 1103. However, the silicide region may be formed in the pixel region 1104. The silicide region can be provided by providing a portion which is not covered with the preventive layer 1204.

An interlayer insulation film 1211 covers the MOS transistors and contact plugs 1205 provided in the interlayer insulation film 1211 are connected to the source region and the drain region of the MOS transistor 1201. On the interlayer insulation film 1211, an interlayer insulation film 1212 and an interlayer insulation film 1213 are laminated in the stated order from the side of the interlayer insulation film 1211. In this example, the interlayer insulation films 1211 to 1213 contain a silicon oxide film, for example. The interlayer insulation films may be an insulator and may be a single layer or a laminated layer. The interlayer insulation films are not limited to a silicon oxide film. In the case of a solid-state image pick-up device, a material which passes light to be detected is desirable. In this example, the outer edges of the interlayer insulation films 1211 to 1213 are in line with the outer edge 1101 of the preventive layer 1204. However, the position thereof is not limited thereto, and the interlayer insulation films may be formed at the side of the circumference 101 of the wafer.

In or between the interlayer insulation films, a first wiring layer 1206, a second wiring layer 1207, and a third wiring layer 1208 are provided and a via plug 1209 and a via plug 1210 which connect the layers are provided. A protective layer 1215 is provided covering the third wiring layer 1208 and the interlayer insulation film 1213. On the protective film 1215, a reflection preventive film 1216 is provided which reduces reflection on the upper surface of the protective film 1215. Under the protective film 1215, a reflection preventive film 1214 is provided which reduces reflection on the undersurface of the protective film 1215. The configuration of FIG. 12 is not limited and can be varied as appropriate. Thereafter, a color filter, a micro lens, and the like are formed to accomplish a semiconductor device. Herein, the wiring layer contains a conductor containing aluminum as the main component and the plugs contain a conductor containing tungsten as the main component. The protective film is a silicon nitride film, for example. The reflection preventive film may have a refractive index which allows the film to have a function of preventing reflection and is, for example, a silicon oxynitride film.

Herein, the outer edge 1102 of the silicide region is further from the circumference 101 than the outer edge 1101 of the preventive layer. If the outer edge 1101 of the preventive layer is further from the circumference 101 than the outer edge 1102 of the silicide region, the preventive layer 1204 illustrated in the pixel region 1104 of FIG. 12 is not formed, resulting in the formation of a configuration such that the MOS transistor 1201 has the silicide region. More specifically, a portion having an unexpected silicide region is formed. Then, when contact holes for the contact plugs 1205 are formed, a silicide region is exposed in a portion where there is no silicide region. However, due to the fact that the outer edge 1102 of the silicide region is further from the circumference 101 than the outer edge 1101 of the preventive layer as in this example, the formation of a portion having an unexpected silicide region can be suppressed.

Next, an example of a method for manufacturing the configuration of FIG. 12 is described with reference to FIG. 13A to FIG. 14D. A detailed explanation of a general semiconductor manufacturing method is omitted. Moreover, in the following manufacturing method, members before processing and members after processing are designated by the same reference numerals in some cases for simple description. Moreover, the reference numerals of the drawings can be mutually referred to.

Figure 13A:
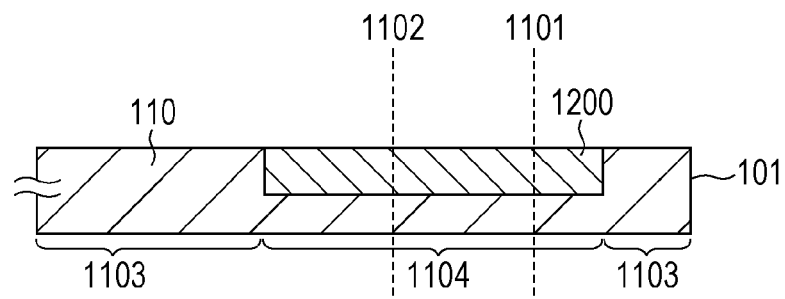
FIG. 13A, FIG. 13B, FIG. 13C, FIG. 13D, and FIG. 13E are cross-sectional schematic views for describing a manufacturing method of Example 5.
Figure 13B:
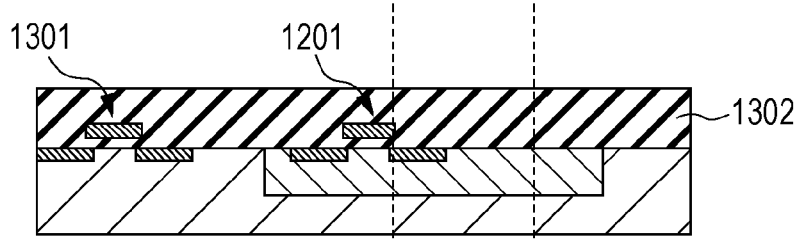
Figure 13C:
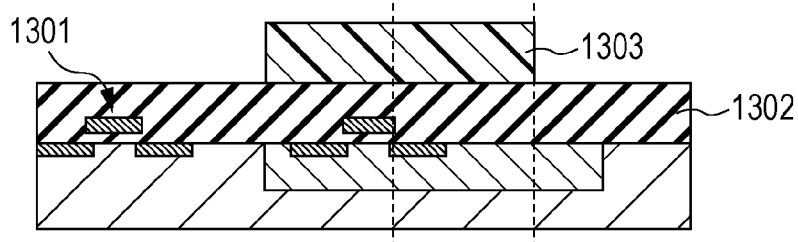

First, a well 1200 is formed in the semiconductor substrate 110 in the pixel region 1104 (FIG. 13A). Then, elements, such as an MOS transistor, are formed. Herein, the MOS transistor 1201 is formed in the pixel region 1104 and an MOS transistor 1301 is formed in the peripheral region 1103. Thereafter, an insulation film 1302 serving as a preventive layer covering both the MOS transistors is formed (FIG. 13B). Herein, the insulation film 1302 serving as a preventive layer is a silicon oxide film. Then, the insulation film 1302 is partially removed using a photoresist pattern 1303 in such a manner as to expose a portion where the preventive layer is not formed, i.e., a portion where the silicide region is formed (FIG. 13C).

Figure 13D:
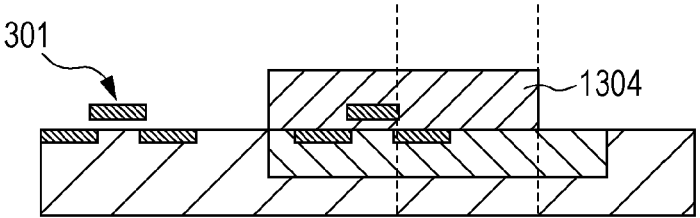

FIG. 13D illustrates a preventive layer 1304 which is formed by partially removing the insulation film 1302 and has the outer edge 1101. It is a matter of course that since the preventive layer 1304 has an arbitrary pattern, the end portion thereof is not in line with the outer edge 1101. However, the preventive layer 1304 is not disposed at the side of the circumference 101 of the wafer relative to the outer edge 1101.

Figure 13E:
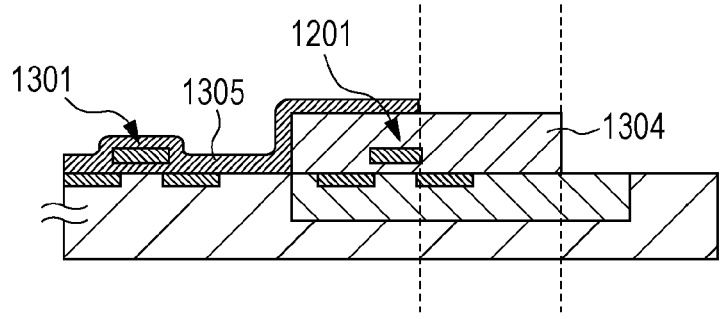

As illustrated in FIG. 13E, a metal film 1305 for forming the silicide region is formed. Herein, the metal film 1305 is a cobalt film for forming cobalt silicide. In addition thereto, the material of the metal film can be selected from metal materials capable of forming silicide. The metal film 1305 covers the source region, the drain region, and the gate electrode of the MOS transistor 1301 while contacting them. In the pixel region 1104, the metal film 1305 contacts the preventive film 1304 and is not in contact with the source region, the drain region, and the gate electrode of the MOS transistor 1201. The end portion of the metal film 1305 is the outer edge 1102 and the metal film is not formed also in a region at the side of the circumference 101 relative to the outer edge 1101 of the preventive layer 1304. As a formation method, the metal film is formed once on the entire surface, and thereafter the metal film at the side of the circumference 101 relative to the outer edge 1102 is removed by wet etching or the like to thereby form the metal film 1305.

Figure 14A:
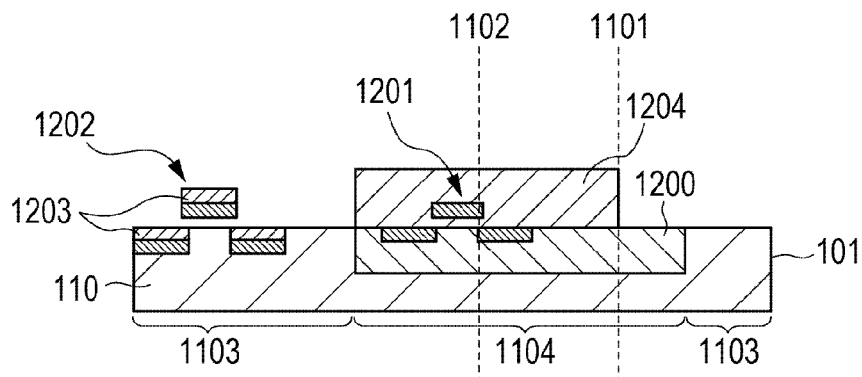
FIG. 14A, FIG. 14B, FIG. 14C, and FIG. 14D are cross-sectional schematic views for describing the manufacturing method of Example 5.

Heat treatment is performed in the state of FIG. 13E to react the metal film 1305 and silicon containing polysilicon to form silicide (silicidation), thereby forming a silicide region. A portion of the metal film 1305 contacting the preventive layer 1304 and not forming silicide or an unreacted portion thereof remaining on silicide is removed. The MOS transistor 1202 has the silicide region 1203 (FIG. 14A).

Figure 14B:
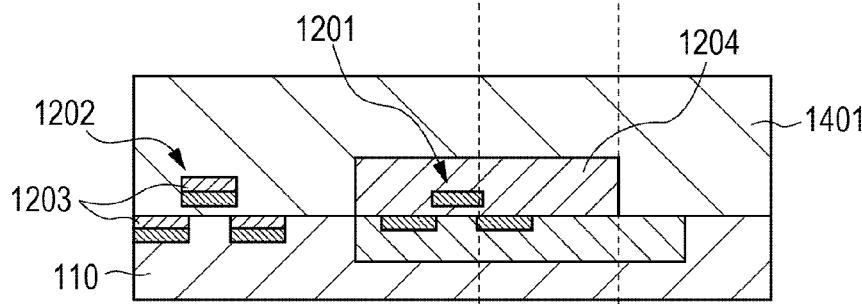
Figure 14C:
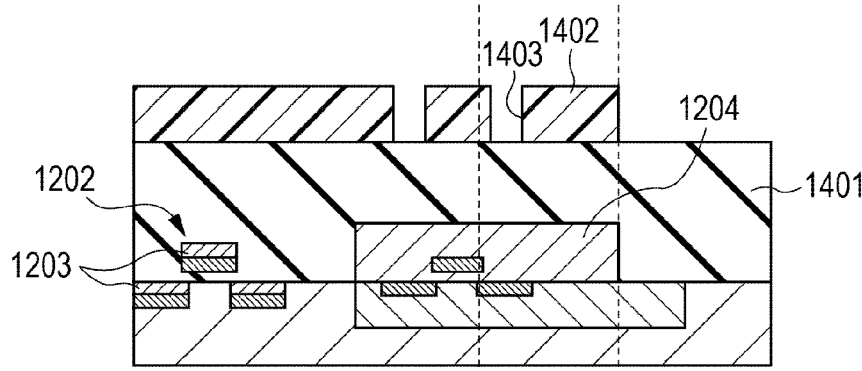
Figure 14D:
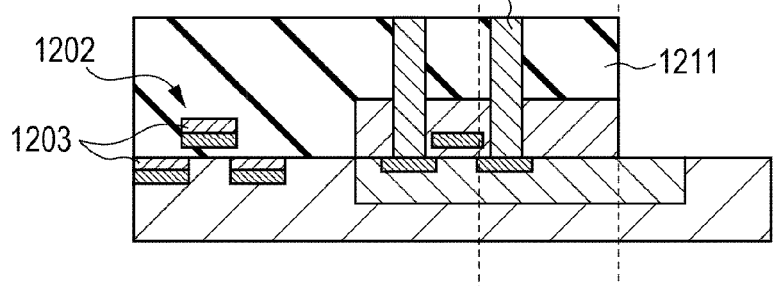

Thereafter, an insulation film 1401 serving as an interlayer insulation film covering the semiconductor substrate 110 is formed (FIG. 14B). On the insulation film 1401, a photoresist pattern 1402 having openings 1403 for the formation of contact holes which expose a portion having no silicide region is formed (FIG. 14C). The end portion of the photoresist pattern 1402 is in line with the outer edge 1101 and brings the end portion of the insulation film 1401 into line with the outer edge 1101. The insulation film 1401 is etched using the photoresist pattern 1402 as a mask to remove the photoresist pattern 1402. This treatment forms the interlayer insulation film 1211. Herein, contact holes are formed in the interlayer insulation film 1211. Thereafter, a conductor is provided in the contact holes to form the contact plugs 1205, so that the configuration of FIG. 14D is obtained. Thereafter, by a general semiconductor manufacturing method, a wiring layer and the like are formed, and then the configuration of FIG. 12 is formed. Thus, this example is carried out.

In this example, the case of silicide is described. However, the invention can also be applied to a case where a process of forming an opening which exposes a metal film, such as a light-shielding film, for example, is provided. Specifically, a solid-state image pick-up device having a charge holding portion and having a light-shielding film containing a metal film for blocking light is mentioned. Although the silicide region of this example is formed on the gate electrode, the source region, and the drain region of the MOS transistor, the silicide region may be formed in any one of them or a part of any one of them.

EXAMPLE 6

This example describes a method for suppressing metal contamination different from the method of Example 5. In Example 5, the outer edge 1102 of the region where the metal film for forming the silicide region is formed is further from the circumference 101 of the wafer than the outer edge 1101 of the preventive layer for preventing the formation of the silicide region. However, in this example, the outer edge of the preventive layer for preventing the formation of the silicide region is further from the circumference of the wafer than the outer edge of the region where the metal film for forming the silicide region is formed. Due to the fact that the outer edge of the region where the metal film is formed is not included in a region where the silicide region is not formed, herein a pixel region, the occurrence of metal contamination can be suppressed. Hereinafter, Example 6 is described in detail with reference to FIGS. 15A to 15C.

Figure 15A:
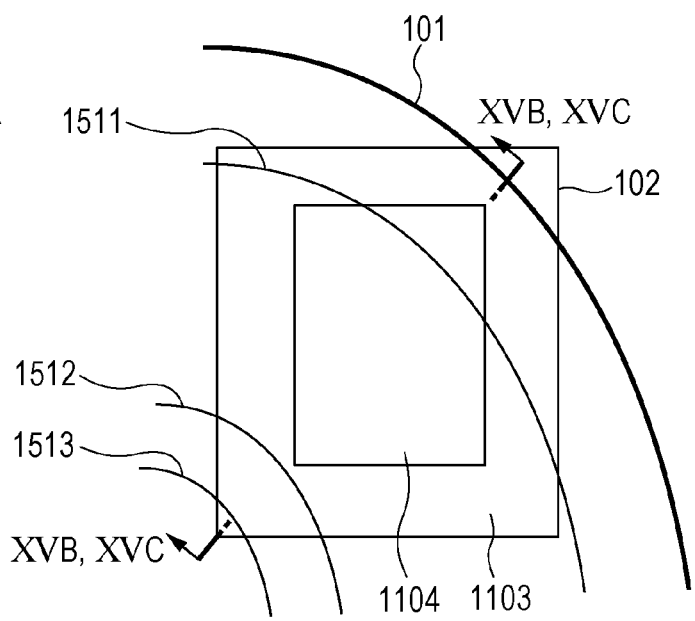
FIG. 15A is a plan schematic view of a wafer for describing a manufacturing method of Example 6.
Figure 15B:
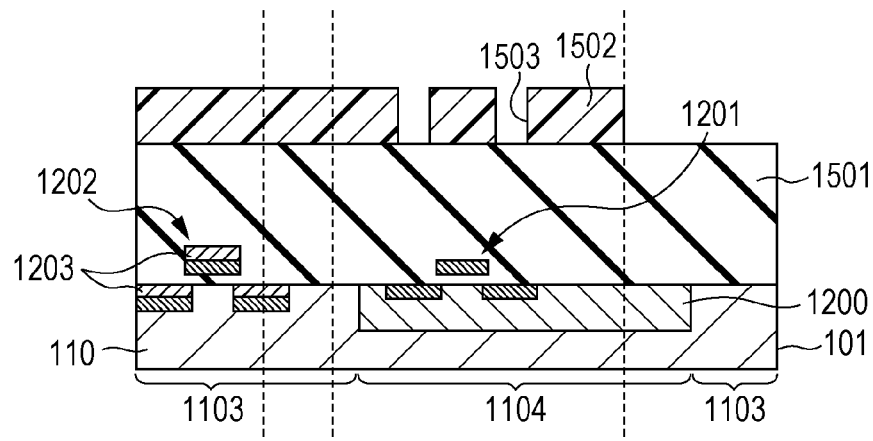
FIG. 15B is cross-sectional schematic view of the wafer for describing the manufacturing method of Example 6.
Figure 15C:
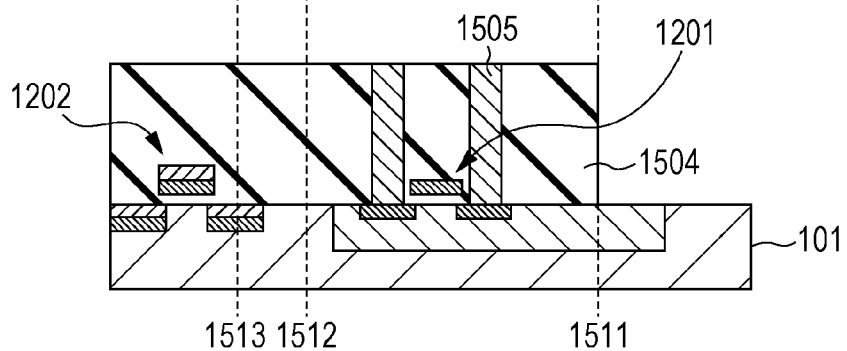
FIG. 15C is a cross-sectional schematic view of the wafer for describing the manufacturing method of Example 6.

FIG. 15A is a plan schematic view of a wafer corresponding to FIG. 11. FIG. 15B and FIG. 15C are cross-sectional schematic views corresponding to FIG. 14C and FIG. 14D. In FIG. 15A to FIG. 15C, the same configurations as those of other examples are designated by the same reference numerals and the description thereof is omitted.

As illustrated in FIG. 15A, in this example, an outer edge 1513 of a preventive layer for preventing the formation of a silicide region is further from a circumference 101 of a wafer than an outer edge 1512 of a region where a metal film for forming the silicide region is formed. However, the outer edge 1512 of the metal film does not cross a pixel region 1104. Due to such a configuration, an unexpected silicide region is not formed in the pixel region 1104 where the silicide region is not to be formed. Therefore, the silicide region is not exposed during the formation of a contact hole in the pixel region 1104. The outer edge 1511 of the interlayer insulation film is provided at the side of the outermost circumference 101.

A manufacturing method is partially described with reference to FIG. 15B and FIG. 15C. The configuration of FIG. 15B can be manufactured by the same method as the processes illustrated in FIG. 13A to FIG. 14B of Example 5. However, in FIG. 15B, since the outer edge 1513 of the preventive layer is further from the circumference 101 than the pixel region 1104, the preventive layer is not formed in the pixel region 1104. However, the outer edge 1512 of the metal film does not enter the pixel region 1104, the silicide region is not formed on the MOS transistor 1201. Then, a photoresist pattern 1502 having openings 1503 is formed on the insulation film 1501 similarly as in FIG. 14C of Example 5 (FIG. 15B). The insulation film 1501 is etched to be removed using the photoresist pattern 1502 as a mask to thereby form an interlayer insulation film 1504 having contact holes. By providing a conductor in the contact holes, contact plugs 1505 are formed, so that the configuration of FIG. 15C is obtained.

Herein, the outer edge 1501 of the photoresist pattern 1502, i.e., the outer edge of the interlayer insulation film 1504, is illustrated. The configuration of this example can also suppress metal contamination.

Figure 10:
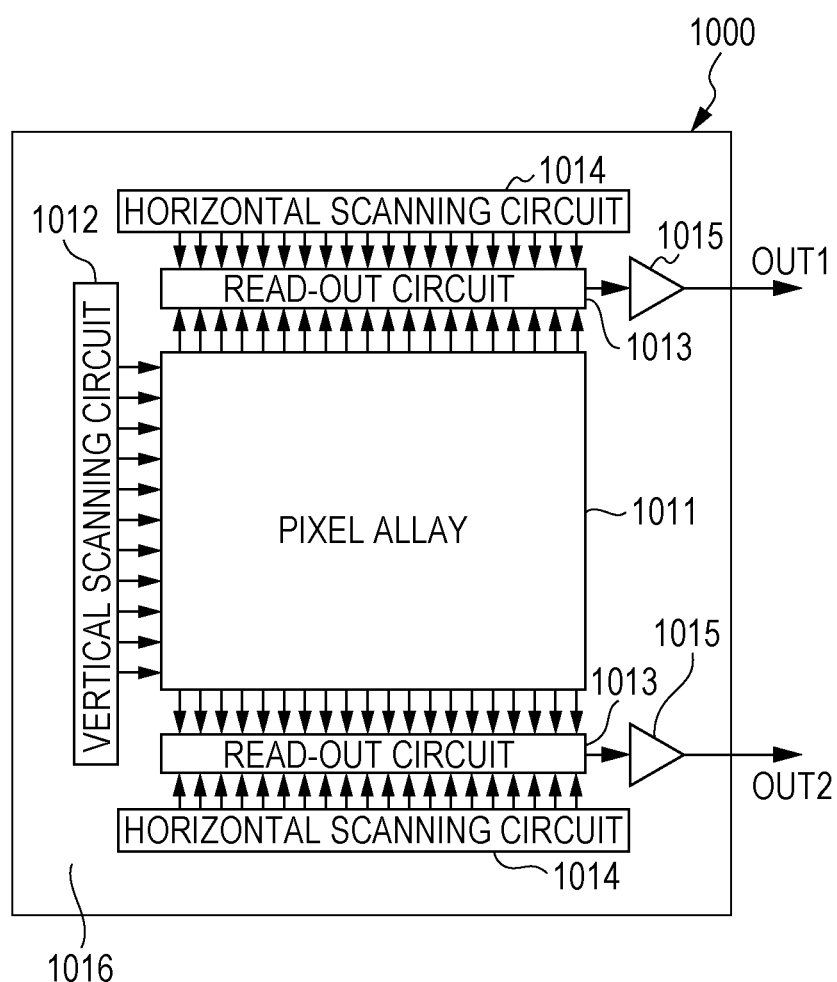
FIG. 10 is a plan schematic view for describing a solid-state image pick-up device.

Finally, the configuration of a solid-state image pick-up device is described as an example of the semiconductor device of the invention. FIG. 10 is a plan schematic view for describing a solid-state image pick-up device 1000. The solid-state image pick-up device 1000 equivalent to one semiconductor device of FIG. 2A is a CMOS type solid-state image pick-up device, for example. In FIG. 10, the solid-state image pick-up device 1000 has a pixel portion 1011, a vertical scanning circuit 1012, two readout circuits 1013, two horizontal scanning circuits 1014, and two output amplifiers 1015. A region other than a pixel portion 1011 is referred to as a peripheral circuit portion 1016. The pixel portion 1011 is constituted by two-dimensionally arranging a plurality of pixels. Each pixel has at least a photoelectric conversion element and can contain a transistor for reading out, or the like. The optical waveguide described above is disposed above the photoelectric conversion element corresponding to the photoelectric conversion element. The readout circuits 1013 contain, for example, a column amplifier, a CDS circuit, an addition circuit, and the like and perform amplification, addition, and the like of signals read out from pixels of a line selected by the vertical scanning circuit 1012 through a vertical signal line. The column amplifier, the CDS circuit, the addition circuit, and the like are disposed for every pixel row or a plurality of pixel rows, for example. The horizontal scanning circuits 1014 generate signals for sequentially reading signals of the readout circuits 1013. The output amplifiers 1015 amplify and output signals of a line selected by the horizontal scanning circuits 1014. The readout circuits 1013, the horizontal scanning circuits 1014, and the output amplifiers 1015 constitute a dual output path, and therefore are disposed one by one at upper and lower portions with the pixel portion 1011 interposed therebetween. However, three or more output paths may be provided.

The above-described configuration is merely one example of the configuration of a solid-state image pick-up device, and the configuration of the solid-state image pick-up device is not limited to the above-described configuration. For example, the solid-state image pick-up device 1000 may be a CCD type solid-state image pick-up device. Moreover, the invention can be applied to other semiconductor devices, such as a memory.

According to the method for manufacturing a semiconductor device of the invention, the occurrence of metal contamination can be suppressed also when removing a plurality of insulation films. Moreover, according to the configuration of a wafer of the invention, a semiconductor device with less noise can be provided. The invention is not limited to the above-described examples and the examples can be modified and combined as appropriate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026349 filed Feb. 9, 2011 and No. 2011-223295 filed Oct. 7, 2011, which are hereby incorporated by reference herein in their entirety.

What is claimed is:

1. A method for manufacturing a semiconductor device, comprising:

preparing a semiconductor wafer having a wiring layer having conductive patterns and a plurality of insulation films containing a first insulation film surrounding side surfaces of the conductive patterns; and removing some regions of the plurality of insulation films to form openings;

wherein the first insulation film being disposed closer to a circumference of the semiconductor wafer than the conductive patterns.

2. The method according to claim 1, wherein
the preparing the semiconductor wafer includes:
forming the plurality of insulation films on the semiconductor wafer; and
forming the wiring layers.

3. The method according to claim 2, wherein
the forming the wiring layer includes:
forming the conductive patterns which are formed in grooves formed in the first insulation film after forming the first insulation film in the forming the plurality of insulation films.

4. The method according to claim 2, wherein
the forming the wiring layer includes:
forming the conductive patterns before forming the first insulation film in the forming the plurality of insulation films; and
the conductive patterns are covered by the first insulation film in the forming the first insulation film.

5. The method according to claim 1, wherein the conductive patterns contain a material containing copper as a main component.

6. The method according to claim 1, wherein the semiconductor device contains a plurality of photoelectric conversion elements.

7. The method according to claim 6, further comprising:
after the removing some regions of the plurality of insulation films,
forming a high refractive-index film whose refractive index is higher than that of the first insulation film in the regions.

8. The method according to claim 7, further comprising:
removing at least one part of the high refractive-index film after the formation of the high refractive-index film, wherein
in the removing at least one part of the high refractive-index film,
at least one part of the high refractive-index film is disposed further from the circumference of the semiconductor wafer than the first insulation film.

9. The method according to claim 7, wherein
the first insulation film contains an insulation film at least containing silicon oxide; and
the high refractive-index film contains nitride silicon.

10. The method according to claim 1, comprising:
after the removing some regions of the plurality of insulation films,
forming a conductor in the regions to form a through hole via.

11. The method according to claim 1, wherein
the removing some regions of the plurality of insulation films includes:
forming photoresist on the plurality of insulation films; and
exposing and patterning the photoresist to form a mask, wherein
in the exposing and patterning the photoresist,
a region corresponding to a plurality of the semiconductor devices is exposed by one exposure.

12. The method according to claim 11, further comprising:
dividing the plurality of the semiconductor devices.

13. The method according to claim 12, further comprising:
the plurality of the semiconductor devices includes a semiconductor device having the circumference of the semiconductor wafer.

14. A method for manufacturing a semiconductor device, comprising:
preparing a semiconductor wafer having a conductor portion and a plurality of insulation films; and
removing some regions of the plurality of insulation films to form openings,
wherein the preparing the semiconductor wafer includes forming a first insulation film and forming a conductor portion by forming a conductive film on the first insulation film,
wherein the first insulation film being formed so that an outer edge of the first insulation film is disposed further from a circumference of the semiconductor wafer than the conductive film.

15. The method according to claim 14, further comprising:
dividing the plurality of the semiconductor devices.

16. The method according to claim 15, wherein the plurality of the semiconductor devices includes a semiconductor device having the circumference of the semiconductor wafer.

* * * * *